(12) United States Patent
Chen et al.

(10) Patent No.: US 10,851,970 B2
(45) Date of Patent: Dec. 1, 2020

(54) CASING, ELECTRONIC DEVICE, AND METHOD OF FABRICATING CASING

(71) Applicant: Wistron Corporation, New Taipei (TW)

(72) Inventors: Yi-An Chen, New Taipei (TW); Hsin-Chi Chen, New Taipei (TW); Yu-Teng Chang, New Taipei (TW); Ying-Chi Wu, New Taipei (TW); Hsiang-Ho Lo, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/423,195

(22) Filed: May 28, 2019

(65) Prior Publication Data
US 2020/0271302 A1 Aug. 27, 2020

(30) Foreign Application Priority Data
Feb. 25, 2019 (TW) .............................. 108106373 A

(51) Int. Cl.
| | | |
|---|---|---|
| *F21V 21/00* | (2006.01) | |
| *F21V 11/08* | (2006.01) | |
| *B41M 1/30* | (2006.01) | |
| *F21W 111/00* | (2006.01) | |
| *F21Y 115/10* | (2016.01) | |

(52) U.S. Cl.
CPC .............. *F21V 11/08* (2013.01); *B41M 1/30* (2013.01); *F21W 2111/00* (2013.01); *F21Y 2115/10* (2016.08)

(58) Field of Classification Search
CPC . F21V 11/08; B41M 1/30; B41M 1/34; F21Y 2115/10; F21W 2111/00
USPC ...................................................... 362/23.19
See application file for complete search history.

(56) References Cited

U.S. PATENT DOCUMENTS

| | | | | |
|---|---|---|---|---|
| 10,520,159 | B1 * | 12/2019 | Tsai ..................... | B60Q 1/0052 |
| 2010/0045897 | A1 * | 2/2010 | Kim ................... | G02F 1/133606 |
| | | | | 349/64 |
| 2011/0051412 | A1 * | 3/2011 | Jeong ................ | G02F 1/133603 |
| | | | | 362/235 |
| 2011/0299134 | A1 * | 12/2011 | Shimoyama ......... | H03K 17/962 |
| | | | | 358/474 |
| 2012/0170253 | A1 * | 7/2012 | Park .................. | G02F 1/133605 |
| | | | | 362/97.1 |

(Continued)

*Primary Examiner* — Laura K Tso
(74) *Attorney, Agent, or Firm* — JCIPRNET

(57) ABSTRACT

A method of fabricating a casing including steps of providing a polycarbonate substrate, printing a first material on the polycarbonate substrate to form a light shielding layer by using a first screen, and printing a second material on the light shielding layer to form a light transmission layer by using a second screen is provided. The light shielding layer has at least one patterned transmissive region. The light transmission layer covers the at least one patterned transmissive region and a portion of polycarbonate substrate exposed by the at least one patterned transmissive region. Mesh counts of the first screen is greater than that of the second screen. A casing including a polycarbonate substrate, a light shielding layer, and a light transmission layer is provided. A thickness of the light transmission layer is greater than a thickness of the light shielding layer. An electronic device adopting the casing is provided.

11 Claims, 7 Drawing Sheets

(56) References Cited

U.S. PATENT DOCUMENTS

2015/0217681 A1\* 8/2015 Dellock ............... B60Q 1/2696
362/510

\* cited by examiner

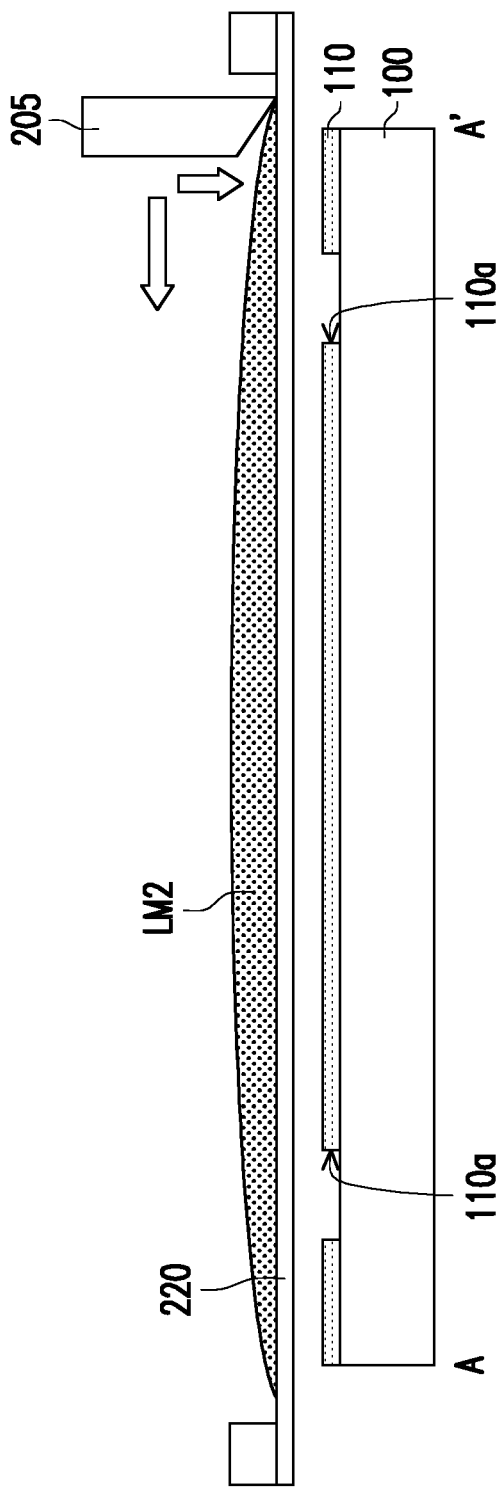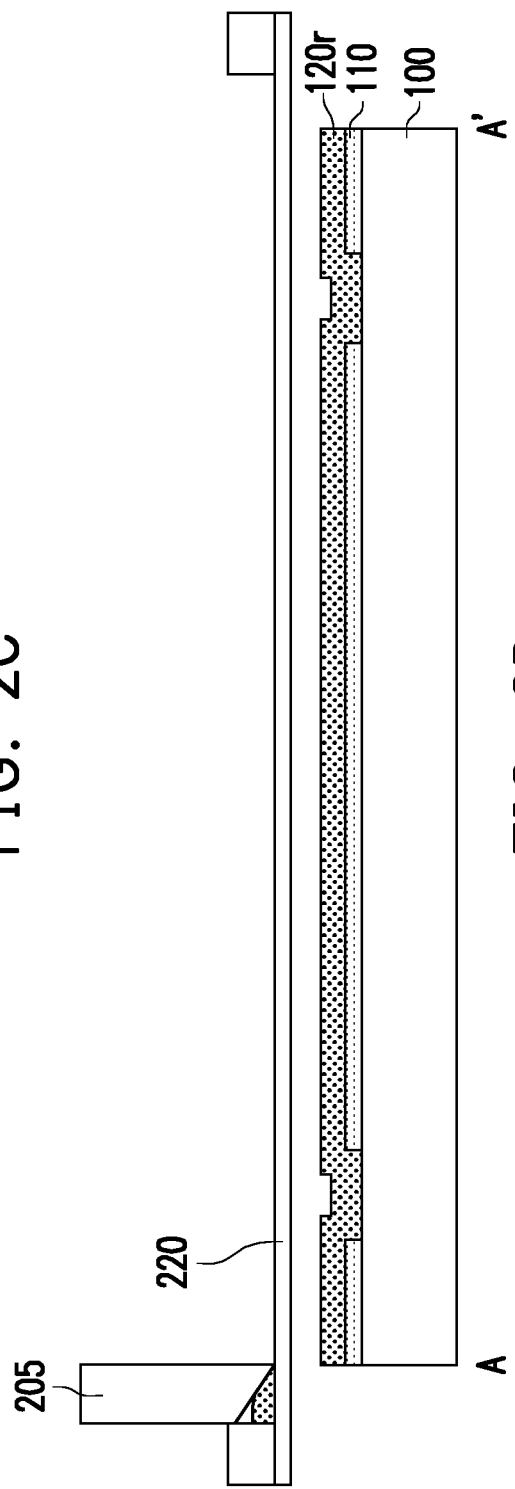

CASING, ELECTRONIC DEVICE, AND METHOD OF FABRICATING CASING

CROSS-REFERENCE TO RELATED APPLICATION

This application claims the priority benefit of Taiwan application serial no. 108106373, filed on Feb. 25, 2019. The entirety of the above-mentioned patent application is hereby incorporated by reference herein and made a part of this specification.

BACKGROUND

Technical Field

The disclosure relates to a casing, an electronic device, and a method of fabricating the same; more particularly, the disclosure relates to a casing featuring a smooth appearance and capable of performing an indication function, an electronic device, and a method of fabricating the same.

Description of Related Art

With the advancement of technology, electronic products and home appliances for different purposes have gradually become indispensable in people's lives. In addition to functional improvements of smart phones, notebook computers, information home appliances, etc., the requirements for product appearance are increasing. In order to enhance the elegance of the appearance of the electronic devices, manufacturers are committed to the development of hidden functional icons.

In general, a light transmissive material and an opaque material are formed on the casing through double injection to achieve a visually hidden effect. However, there tend to be gaps or small protrusions generated by mutual extrusion and formed at the junction of the two material layers formed through double injection molding, which easily leads to a tactile sensation of step difference and reduces the effect of hiding the icons or symbols. Accordingly, said issues have to be overcome by the manufacturers who intend to fabricate the casing having the simple appearance and achieving functional decorative effects.

SUMMARY

The disclosure provides a method of fabricating of a casing with a texture satisfying the sense of touch and sight.

The disclosure provides a casing with a texture satisfying the sense of touch and sight.

The disclosure provides an electronic device adopting said casing with the texture satisfying the sense of touch and sight.

In an embodiment of the disclosure, a method of fabricating a casing includes: providing a polycarbonate substrate, printing a first material on the polycarbonate substrate to form a light shielding layer by using a first screen, and printing a second material on the light shielding layer to form a light transmission layer by using a second screen. The light shielding layer has at least one patterned light transmissive region, and the light transmission layer covers the at least one patterned transmissive region and a portion of the polycarbonate substrate exposed by the at least one patterned transmissive region. Mesh counts of the first screen is greater than mesh counts of the second screen.

In an embodiment of the disclosure, a casing includes a polycarbonate substrate, a light shielding layer, and a light transmission layer. The light shielding layer is formed on the polycarbonate substrate and has at least one patterned transmissive region. The light transmission layer is formed on the light shielding layer and covers the at least one patterned transmissive region and a portion of the polycarbonate substrate exposed by the at least one patterned transmissive region. A thickness of the light transmission layer is greater than a thickness of the light shielding layer.

In an embodiment of the disclosure, an electronic device includes a casing and a light source. The casing includes a polycarbonate substrate, a light shielding layer, and a light transmission layer. The light shielding layer is formed on the polycarbonate substrate and has at least one patterned transmissive region. The light transmission layer is formed on the light shielding layer and covers the at least one patterned transmissive region and a portion of the polycarbonate substrate exposed by the at least one patterned transmissive region. A thickness of the light transmission layer is greater than a thickness of the light shielding layer. The light source is configured to emit a light beam, and the light beam passes through the polycarbonate substrate, the at least one patterned transmissive region of the light shielding layer, and the light transmission layer.

According to an embodiment of the disclosure, the step of forming the light shielding layer and the light transmission layer includes: enabling a thickness of the light transmission layer to be greater than a thickness of the light shielding layer.

According to an embodiment of the disclosure, at least one portion of the light transmission layer covers the at least one patterned transmissive region. The step of forming the light transmission layer includes: enabling a thickness of the at least one portion of the light transmission layer to be greater than a thickness of the other portion of the light transmission layer.

According to an embodiment of the disclosure, a ratio of the mesh counts of the second screen to the mesh counts of the first screen is within a range from 0.4 to 0.7.

According to an embodiment of the disclosure, the method of fabricating the casing further includes: curing the first material before forming the light transmission layer, so as to form the light shielding layer.

According to an embodiment of the disclosure, the method of fabricating the casing further includes: curing the second material to form the light transmission layer.

According to an embodiment of the disclosure, the method of fabricating the casing further includes: forming a protection layer on the light transmission layer.

According to an embodiment of the disclosure, the method of fabricating the casing further includes: after forming the light shielding layer and the light transmission layer, cutting the polycarbonate substrate, the light shielding layer, and the light transmission layer.

According to an embodiment of the disclosure, at least one portion of the light transmission layer of the casing covers the at least one patterned transmissive region, and a thickness of the at least one portion of the light transmission layer is greater than a thickness of the other portion of the light transmission layer.

According to an embodiment of the disclosure, the casing further includes a protection layer formed on the light transmission layer.

As provided above, in the casing and the method of fabricating the same according to one or more embodiments of the disclosure, since the amount of the second material printed on the substrate is greater than the amount of the first material printed on the substrate, the second material backfills and fills the patterned transmissive region of the light shielding layer made of the first material, which is conducive to the reduction of the tactile sensation of step difference of the patterned transmissive region of the light shielding layer, thus concealing patterns or symbols on the casing. In another aspect, the electronic device provided in one or more embodiments of the disclosure adopts the aforesaid casing, and thus the visual sensation of the step difference generated by the light beam emitted by the light source of the electronic device can also be reduced significantly after the light beam passes through the patterned transmissive region of the light shielding layer.

To make the above features and advantages provided in one or more of the embodiments more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

FIG. 2A through FIG. 2E are schematic cross-sectional views showing a process of fabricating the casing depicted in FIG. 1.

DESCRIPTION OF THE EMBODIMENTS

Figure 1:
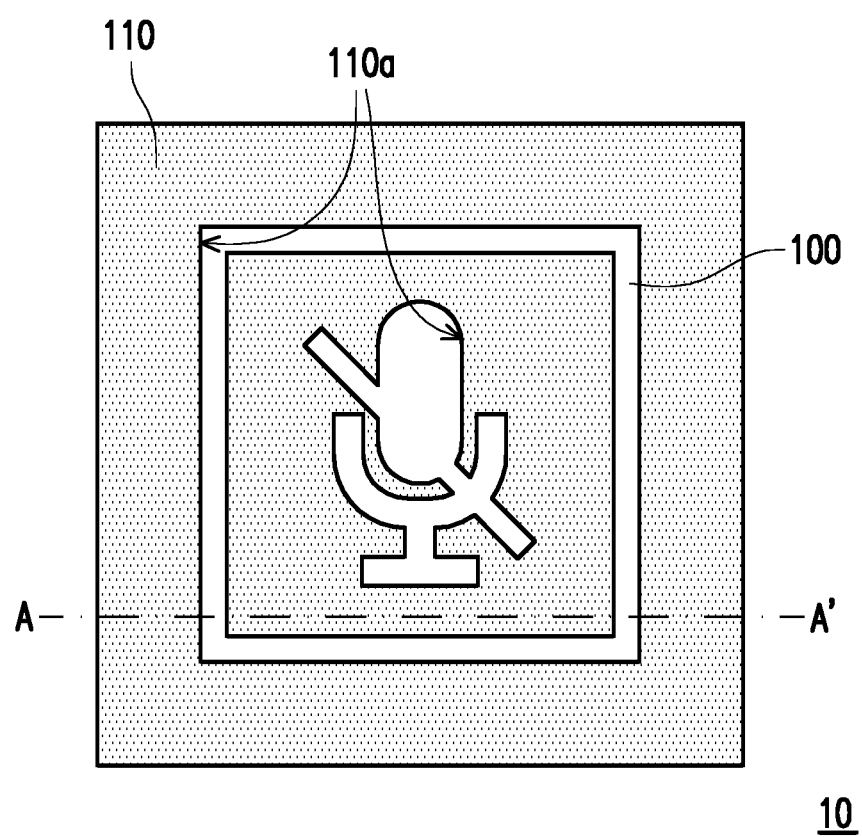
FIG. 1 is a schematic view of a casing according to an embodiment of the disclosure.

Descriptions provided in the disclosure are given with reference to the exemplary embodiments illustrated with accompanied drawings, wherein same or similar parts are denoted with same reference numerals. Wherever possible, the same reference numbers are used in the drawings and the description to refer to the same or like parts.

Figure 5:
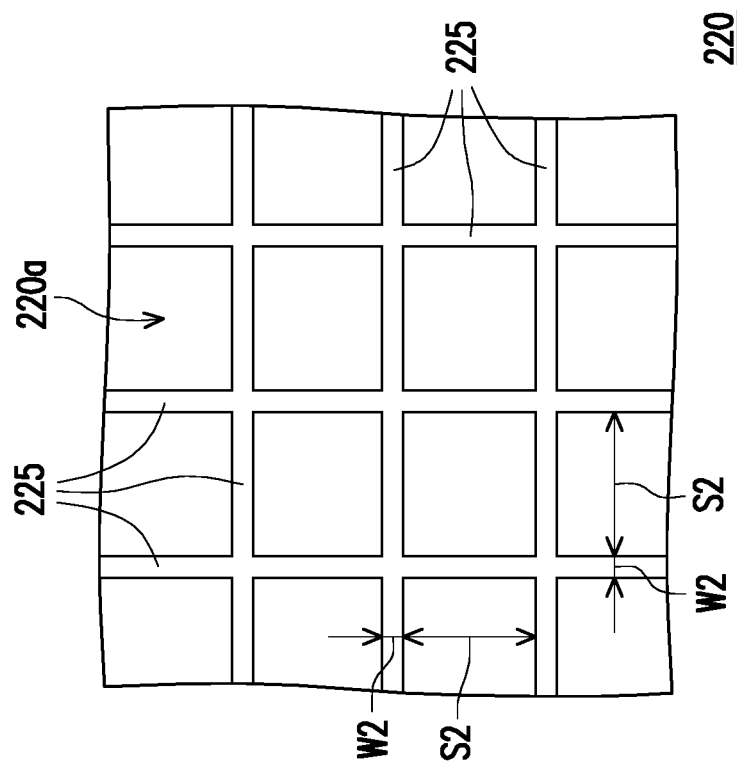
FIG. 5 is a schematic view illustrating a second screen used in a process of fabricating a casing according to an embodiment of the disclosure.
Figure 4:
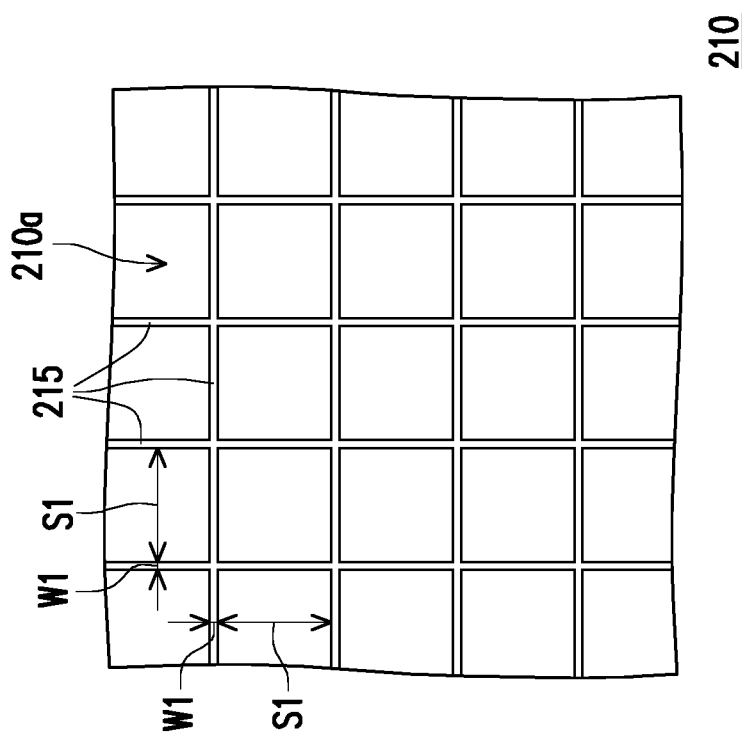
FIG. 4 is a schematic view illustrating a first screen used in a process of fabricating a casing according to an embodiment of the disclosure.
Figure 7:
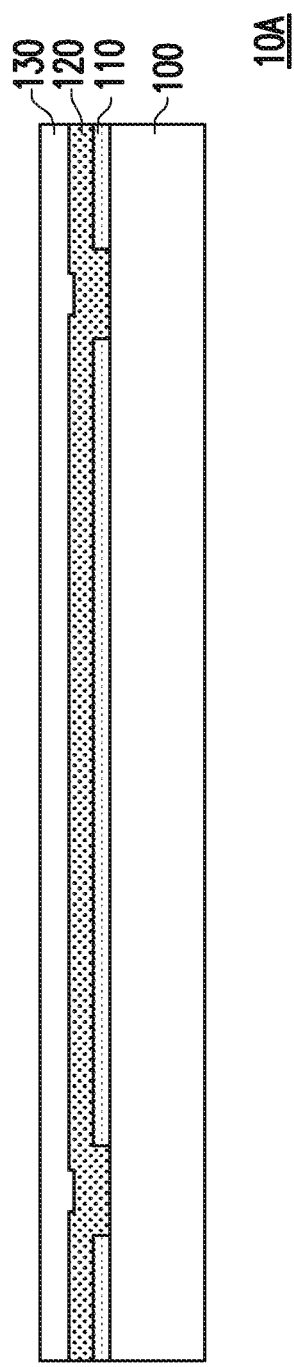
FIG. 7 is a schematic cross-sectional view of a casing according to another embodiment of the disclosure.

FIG. 1 is a schematic view of a casing 10 according to an embodiment of the disclosure. FIG. 2A through FIG. 2E are schematic cross-sectional views showing a process of fabricating the casing 10 depicted in FIG. 1. FIG. 7 is a schematic cross-sectional view of a casing according to another embodiment of the disclosure. Note that FIG. 2A through FIG. 2E correspond to the sectional line A-A' depicted in FIG. 1. It should be mentioned that the casing 10 depicted in FIG. 1 is exemplified as having one icon or symbol, and the type and the number of the icon or symbol on the casing are not limited in the disclosure. Besides, for a clear illustration, the transmission layer 120 depicted in FIG. 2E is omitted in FIG. 1, the mesh lines 215 of the first screen 210 depicted in FIG. 4 is omitted in the first screen 210 depicted in FIG. 2A and FIG. 2B, and the mesh lines 225 of the second screen 220 depicted in FIG. 5 is omitted in the second screen 220 depicted in FIG. 2C and FIG. 2D.

Figure 2A:
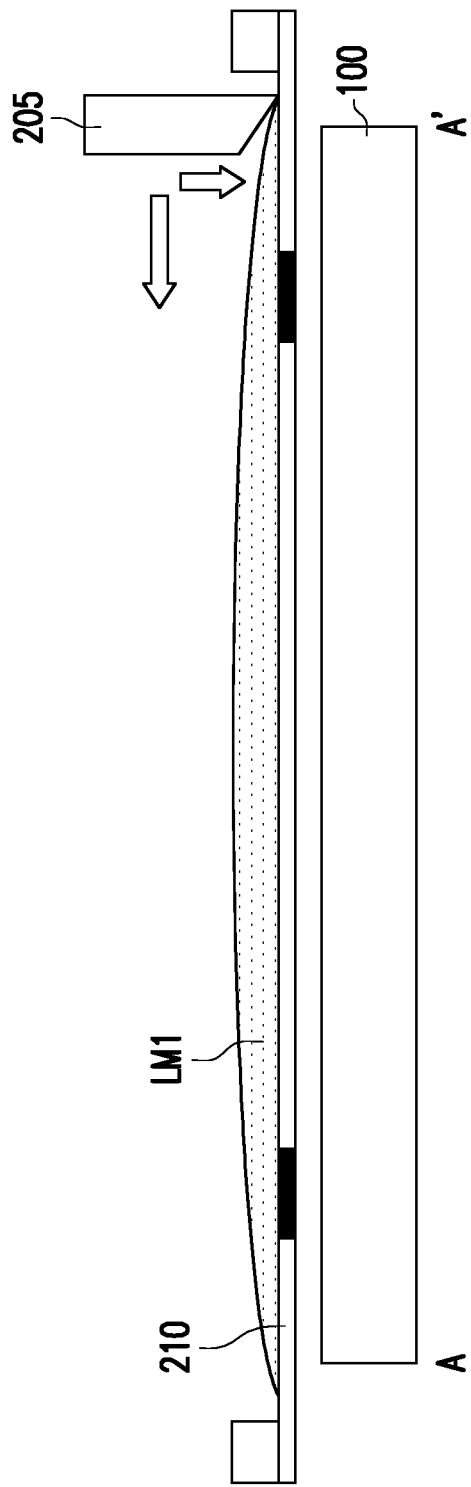
Figure 2B:
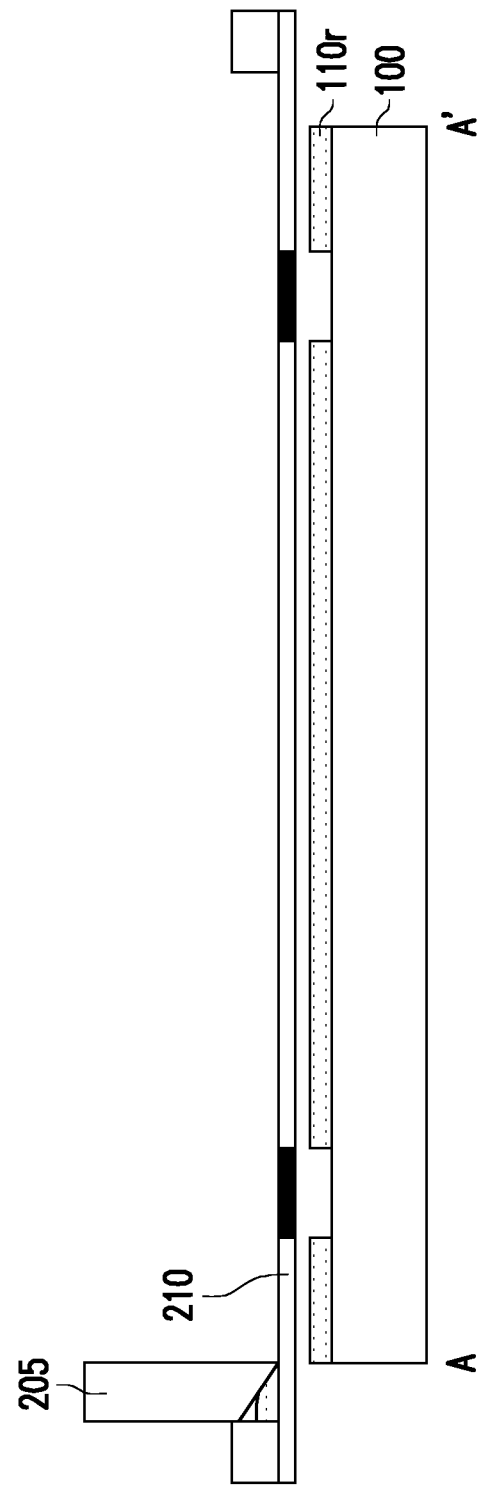
Figure 2E:
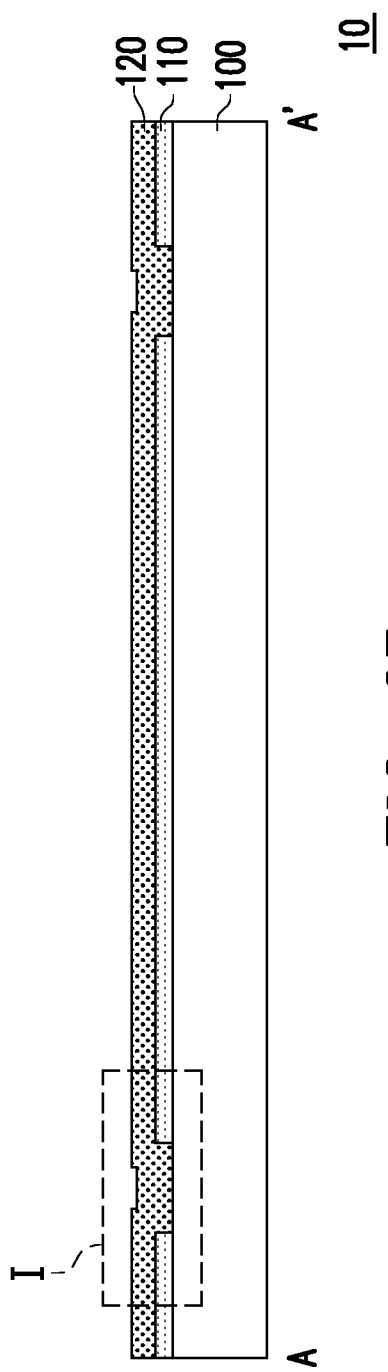

With reference to FIG. 2A, a substrate 100 is provided. A material of the substrate 100 includes an organic polymer (e.g., polycarbonate, epoxy resin, or polymethyl methacrylate) or other materials suitable for making the casing. As shown in FIG. 2A to FIG. 2C, a light shielding layer 110 is formed on the substrate 100. For instance, according to the embodiment, a step of forming the light shielding layer 110 may be performed through screen printing. Specifically, the step of forming the light shielding layer 110 includes: placing a first screen 210 above the substrate 100 and coating the first screen 210 with a first material ink LM1, as shown in FIG. 2A; next, a scraper 205 moves along a direction on a surface of the first screen 210 to press the first screen 210 onto the printed substrate 100 and print the first material ink LM1 from mesh openings 210a (shown in FIG. 4) of the first screen 210 to the substrate 100. As shown in FIG. 2B, after the scraper 205 moves from one side of the first screen 210 to the other side of the first screen 210, a first material layer 110r can be formed on the substrate 100. The first material layer 110r is then dried to form the light shielding layer 110. According to the embodiment, the method of fabricating the casing 10 may selectively include curing the first material layer 110r to form the light shielding layer 110, and the curing method may include baking, illuminating, or any other curing method known to people having ordinary skill in the pertinent art.

With reference to FIG. 2C, the light shielding layer 110 has an opening 110a, and the step of forming the light shielding layer 110 may further selectively include: patterning the opening 110a to form a patterned opening. That is, the first screen 210 used in the step of forming the first material layer 110r may be a patterned screen, and patterns are formed on the first material layer 110r through screen printing. As shown in FIG. 1, an orthogonal projection at an edge of the opening 110a on the substrate 100 defined by the light shielding layer 110 may be an icon or symbol indicative of a muted microphone, which should however not be construed as a limitation in the disclosure; in other embodiments, the orthogonal projection at the edge of the opening 110a on the substrate 100 defined by the light shielding layer 110 may also be an indicative symbol representing a power switch. Note that the opening 110a of the light shielding layer 110 allows light to pass through; namely, the area occupied by the opening 110a may be a light transmissive region of the light shielding layer 110.

As can be seen from FIG. 2C to FIG. 2E that after the light shielding layer 110 is formed through curing, the light transmission layer 120 is formed on the substrate 100. According to the embodiment, a step of forming the light transmission layer 120 may be performed through screen printing. For instance, the step of forming the light transmission layer 120 includes: placing a second screen 220 above the substrate 100 and coating the second screen 220 with a second material ink LM2; next, the scraper 205 moves along a direction on a surface of the second screen 220 to press the second screen 220 onto the printed substrate 100 and print the second material ink LM2 from mesh openings 220a (shown in FIG. 5) of the second screen 220 to the substrate 100. After the scraper 205 moves from one side of the second screen 220 to the other side of the second screen 220, a second material layer 120r can be formed on the substrate 100. The second material layer 120r covers the light shielding layer 110 and a portion of the substrate 100 exposed by the opening 110a of the light shielding layer 110.

It is worth mentioning that, in the step of forming the second material layer 120r, since the second material ink LM2 still has the flowability before it is dried, the second material ink LM2 printed around the opening 110a of the light shielding layer 110 may backfill and fill the opening 110a of the light shielding layer 110, so that the thickness of the second material layer 120r in the opening 110a is greater than the thickness of the second material layer 120r on the light shielding layer 110, which is conducive to the reduction of the tactile sensation of step difference of the opening 110a of the light shielding layer 110.

The second material layer 120r is then dried to form the light transmission layer 120. According to the embodiment, the method of fabricating the casing 10 may selectively include curing the second material layer 120r to form the light transmission layer 120, and the curing method may include baking, illuminating, or any other curing method known to people having ordinary skill in the pertinent art. Additionally, in some embodiments, the method of fabricating a casing 10A may also selectively include forming a protection layer 130 on the light transmission layer 120. In other embodiments, the casing may have a plurality of patterns or symbols defined by a plurality of openings 110a of the light shielding layer 110, and the method of fabricating the casing may selectively include cutting the substrate 100, the light shielding layer 110, and the light transmission layer 120 after forming the light shielding layer 110 and the light transmission layer 120. That is, the method of fabricating the casing 10 is applicable when plural casings having a plurality of identical or different transparent icons arc to be fabricated in batches. So far the fabrication of the casing 10 provided in the present embodiment is completed.

Figure 3:
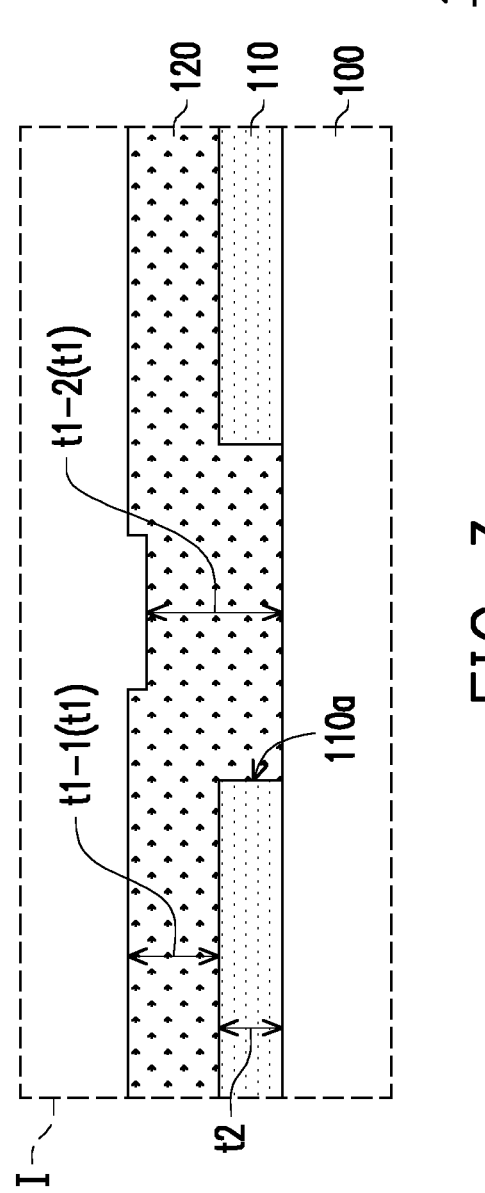
FIG. 3 is an enlarged schematic view of a partial region I of the casing depicted in FIG. 2E.

FIG. 3 is an enlarged schematic view of a partial region I of the casing 10 depicted in FIG. 2E. FIG. 4 is a schematic view illustrating the first screen 210 used in a process of fabricating the casing 10 according to an embodiment of the disclosure. FIG. 5 is a schematic view illustrating the second screen 220 used in a process of fabricating the casing 10 according to an embodiment of the disclosure.

With reference to FIG. 3, the casing 10 includes the substrate 100, the light shielding layer 110, and the light transmission layer 120. The light shielding layer 110 is disposed on the substrate 100 and has the opening 110a. The light transmission layer 120 is disposed on the light shielding layer 110 and covers the opening 110a and a portion of the substrate 100 exposed by the opening 110a. It should be mentioned that a thickness t1 of the light transmission layer 120 is greater than a thickness t2 of the light shielding layer 110. For instance, in the method of fabricating the casing 10, since the mesh counts of the first screen 210 is different from the mesh counts of the second screen 220, the thickness of the second material layer 120r printed on the substrate 100 is greater than the thickness of the first material layer 110r printed on the substrate 100. Here, the thickness of the first material layer 110r is small, so that the step difference made up by the opening 110a of the light shielding layer 110 to be filled up is small; the thickness of the second material layer 120r is large, so that the second material ink LM2 backfills and fills the opening 110a of the light shielding layer 110 before the second material ink LM2 is dried, which is conducive to the reduction of the tactile sensation of step difference of the opening 110a of the light shielding layer 110. The definition of the mesh counts of the screens is explained hereinafter.

As shown in FIG. 4 and FIG. 5, the first screen 210 is constituted by a plurality of mesh lines 215 arranged in two intersecting directions, which forms a plurality of mesh openings 210a, and the second screen 220 is constituted by a plurality of the mesh lines 225 arranged in two intersecting directions, which forms a plurality of mesh openings 220a. In some embodiments, note that the definition of the mesh counts refers to the number of mesh openings of the screen having a plurality of the mesh lines arranged in a direction within a one-inch length range. For instance, the mesh lines 215 of the first screen 210 have a width W1, a distance S1 is between two adjacent mesh lines 215 arranged in the same direction, and the mesh counts of the first screen 210 is one inch/(W1+S1); the mesh lines 225 of the second screen 220 have a width W2, a distance S2 is between two adjacent mesh lines 225 arranged in the same direction, and the mesh counts of the second screen 220 is one inch/(W2+S2). However, these should not be construed as limitations in the disclosure; in other embodiments, the definition of the mesh counts may also refer to the number of mesh openings of the screen within one square inch. For instance, the mesh counts of the first screen 210 may also be one square inch/(W1+S1)$^2$, and the mesh counts of the second screen 220 may also be one square inch/(W2+S2)$^2$.

According to the embodiment, the mesh counts of the first screen 210 can be selectively greater than the mesh counts of the second screen 220; in other words, the area occupied by the mesh openings 220a of the second screen 220 can be selectively greater than the area occupied by the mesh openings 210a of the first screen 210. In some embodiments, a ratio of the mesh counts of the second screen 220 to the mesh counts of the first screen 210 may be within a range from 0.4 to 0.7. As such, in the step of forming the light shielding layer 110 and the step of forming the light transmission layer 120, the amount of the second material ink LM2 printed on the substrate 100 is greater than the amount of the first material ink LM1 printed on the substrate 100, so that the second material ink LM2 backfills and fills the opening 110a of the light shielding layer 110 in the step of forming the second material layer 120r, which is conducive to the reduction of the tactile sensation of step difference of the opening 110a of the light shielding layer 110 and further concealing patterns or symbols on the casing.

As shown in FIG. 2E and FIG. 3, hence, after the material ink (i.e., the first material ink LM1 and the second material ink LM2) is dried and cured, a thickness t1 of the light transmission layer 120 formed by the second material ink LM2 is greater than a thickness t2 of the light shielding layer 11 formed by the first material ink LM1, and a thickness t1-2 of one portion of the light transmission layer 120 overlapping the opening 112a in a normal direction of the substrate 100 is greater than a thickness t1-1 of the other portion of the light transmission layer 120 overlapping the light shielding layer 110 in the normal direction of the substrate 100. From another perspective, the thickness of one portion of the light transmission layer 120 at the opening 110a of the light shielding layer 110 is large, so that the step difference generated by the light transmission layer 120 in the opening 110a is apparently less than the step difference generated by the opening 110a of the light shielding layer 110; that is, the portion of the light transmission layer 120 filling the opening 110a of the light shielding layer 110 contributes to the reduction of the tactile sensation of the step difference of the opening 110a of the light shielding layer 110.

Figure 6:
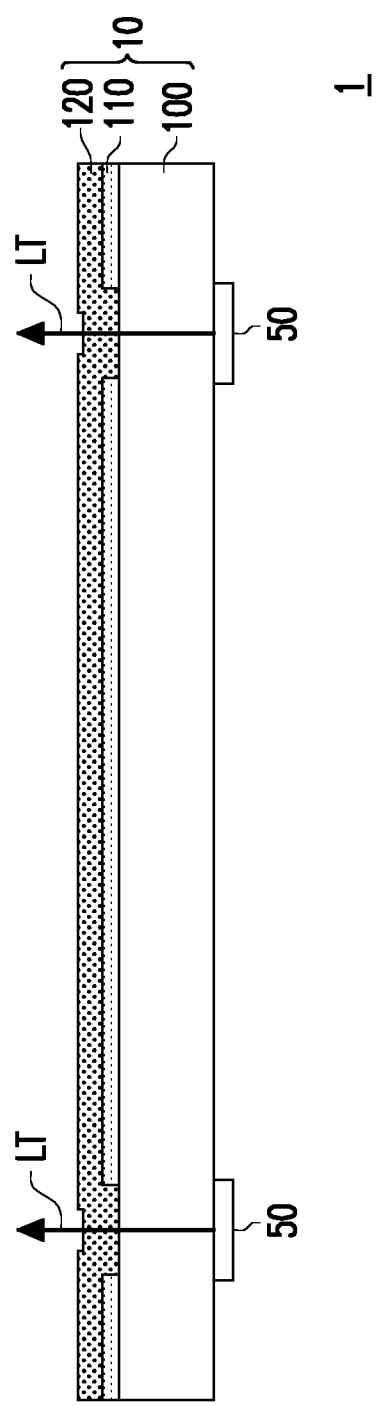
FIG. 6 is a schematic view of an electronic device according to an embodiment of the disclosure.

FIG. 6 is a schematic view of an electronic device according to an embodiment of the disclosure. With reference to FIG. 6, the electronic device 1 adopts the casing 10 described in the previous embodiments, and therefore the same or similar structural arrangement and technical effects will not be further described below. According to the embodiment, the electronic device 1 further has light sources 50 configured to light beams LT, and the number of the light sources 50 is two, for instance. For instance, the two light sources 50 are light emitting diodes and can be selectively disposed on one side of the substrate 100 away from the light shielding layer 110, and the two light sources 50 in the normal direction of the substrate 100 are overlapped with the light transmissive region of the light shielding layer 110. However, these should not be construed as limitations in the disclosure; according to some embodiments, the electronic device can further selectively include a light guide plate, and the light sources 50 in the normal direction of the substrate 100 may not be overlapped with the light transmissive region of the light shielding layer 110. For instance, the light sources 50 may be disposed on a light incident surface of the light guide plate, and the light exit surface of the light guide plate is overlapped with the light transmissive region of the light shielding layer 110. That is, the arrangement of the casing 10 and the light sources 50 is not limited to the arrangement depicted in the drawings of the disclosure.

To be specific, the light beams LT emitted by the light sources 50 are transmitted toward one side of the substrate 100 where the light shielding layer 110 is disposed, pass through the light transmissive region of the light shielding layer 110 and the light transmission layer 120, and are transmitted to human eyes. Note that after a user receives the light beams LT emitted from the casing 10, the visual sensation of the step difference of the light transmissive region of the light shielding layer 110 is obviously significant reduced. Namely, while the user is using the electronic device 1, the user is able to have better experiences in tactile and visual sensations.

To sum up, in the casing and the method of fabricating the same according to one or more embodiments of the disclosure, since the amount of the second material printed on the substrate is greater than the amount of the first material printed on the substrate, the second material backfills and fills the patterned transmissive region of the light shielding layer made of the first material, which is conducive to the reduction of the tactile sensation of step difference of the patterned transmissive region of the light shielding layer, concealing patterns or symbols on the casing. In another aspect, the electronic device provided in one or more embodiments of the disclosure adopts the aforesaid casing, and thus the visual sensation of the step difference generated by the light beam emitted by the light source of the electronic device can also be reduced significantly after the light beam passes through the patterned transmissive region of the light shielding layer.

It will be apparent to those skilled in the art that various modifications and variations can be made to the structure provided in the disclosure without departing from the scope or spirit indicated herein. In view of the foregoing, it is intended that the disclosure cover modifications and variations provided they fall within the scope of the following claims and their equivalents.

What is claimed is:

1. A method of fabricating a casing, comprising:
   providing a polycarbonate substrate;
   printing a first material on the polycarbonate substrate by using a first screen to form a light shielding layer, wherein the light shielding layer has at least one patterned transmissive region; and
   printing a second material on the light shielding layer by using a second screen to form a light transmission layer, such that the light transmission layer covers the at least one patterned transmissive region and a portion of the polycarbonate substrate exposed by the at least one patterned transmissive region, wherein mesh counts of the first screen is greater than mesh counts of the second screen,
   wherein the step of forming the light shielding layer and the light transmission layer comprises:
     enabling a thickness of the light transmission layer to be greater than a thickness of the light shielding layer.

2. The method according to claim 1, wherein at least one portion of the light transmission layer covers the at least one patterned transmissive region, and the step of forming the light transmission layer comprises:
   enabling a thickness of the at least one portion of the light transmission layer to be greater than a thickness of the other portion of the light transmission layer.

3. The method according to claim 1, wherein a ratio of the mesh counts of the second screen to the mesh counts of the first screen is within a range from 0.4 to 0.7.

4. The method according to claim 1, further comprising:
   before forming the light transmission layer, curing the first material to form the light shielding layer.

5. The method according to claim 1, further comprising:
   curing the second material to form the light transmission layer.

6. The method according to claim 1, further comprising:
   forming a protection layer on the light transmission layer.

7. The method according to claim 1, further comprising:
   after forming the light shielding layer and the light transmission layer, cutting the polycarbonate substrate, the light shielding layer, and the light transmission layer.

8. A casing comprising:
   a polycarbonate substrate;
   a light shielding layer formed on the polycarbonate substrate and having at least one patterned transmissive region; and
   a light transmission layer formed on the light shielding layer and covering the at least one patterned transmissive region and a portion of the polycarbonate substrate exposed by the at least one patterned transmissive region, wherein a thickness of the light transmission layer is greater than a thickness of the light shielding layer.

9. The casing according to claim 8, wherein at least one portion of the light transmission layer covers the at least one patterned transmissive region, and a thickness of the at least one portion of the light transmission layer is greater than a thickness of the other portion of the light transmission layer.

10. The casing according to claim 8, further comprising a protection layer, wherein the protection layer is formed on the light transmission layer.

11. An electronic device comprising:
    a casing comprising:
      a polycarbonate substrate;
      a light shielding layer formed on the polycarbonate substrate and having at least one patterned transmissive region; and
      a light transmission layer formed on the light shielding layer and covering the at least one patterned transmissive region and a portion of the polycarbonate substrate exposed by the at least one patterned transmissive region, wherein a thickness of the light transmission layer is greater than a thickness of the light shielding layer; and
    a light source configured to emit a light beam, wherein the light beam passes through the polycarbonate substrate, the at least one patterned transmissive region of the light shielding layer, and the light transmission layer.

\* \* \* \* \*